United States Patent
Chen

(10) Patent No.: US 6,838,214 B1
(45) Date of Patent: Jan. 4, 2005

(54) METHOD OF FABRICATION OF RIM-TYPE PHASE SHIFT MASK

(75) Inventor: Ching-Yueh Chen, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 160 days.

(21) Appl. No.: 10/238,268

(22) Filed: Sep. 10, 2002

(51) Int. Cl.⁷ .............................................. G03F 9/00
(52) U.S. Cl. ........................................................ 430/5
(58) Field of Search ............................................ 430/5

(56) References Cited

U.S. PATENT DOCUMENTS

| | | | | |
|---|---|---|---|---|
| 5,272,024 A | * | 12/1993 | Lin | 430/5 |
| 5,300,379 A | | 4/1994 | Dao et al. | 430/5 |
| 5,478,678 A | * | 12/1995 | Yang et al. | 430/5 |
| 5,478,679 A | * | 12/1995 | Loong et al. | 430/5 |
| 5,510,214 A | * | 4/1996 | Pan et al. | 430/5 |
| 5,620,817 A | | 4/1997 | Hsu et al. | 430/5 |
| 5,853,921 A | * | 12/1998 | Moon et al. | 430/5 |
| 5,955,222 A | | 9/1999 | Hibbs et al. | 430/5 |
| 6,007,324 A | | 12/1999 | Tzu et al. | 431/5 |
| 6,294,295 B1 | | 9/2001 | Lin et al. | 430/5 |

* cited by examiner

Primary Examiner—Saleha R. Mohamedulla

(57) ABSTRACT

A new method of provided for the creation of a rim-type phase-shift mask. Layers of phase shifter material, chrome and an etch resist mask having an opening having a first width are created. The layer of chrome is etched, the etch resist mask is removed. The layer of MoSiON is isotropically etched using the patterned and etched layer of chrome as a mask, partially removing the layer of MoSiON from under the chrome mask. A second layer of etch resist is deposited over the surface of the chrome mask, into the opening created through the layer of chrome and further over the surface of the rim of the mask. The second etch resist layer is exposed and developed, whereby the patterned and etched layer of chrome serves as a mask, thereby shielding from exposure and therefore leaving in place the second layer of etch resist where this second layer of photoresist overlies the rim of the phase shift mask. The remaining second layer of photoresist forms a protective layer for the layer of MoSiON. The quartz substrate is etched in accordance with the first width of the opening created through the second layer of etch resist, the second layer of etch resist is removed from above the rim surface areas of the phase shift mask. The patterned and etched layer of chrome is removed.

29 Claims, 5 Drawing Sheets

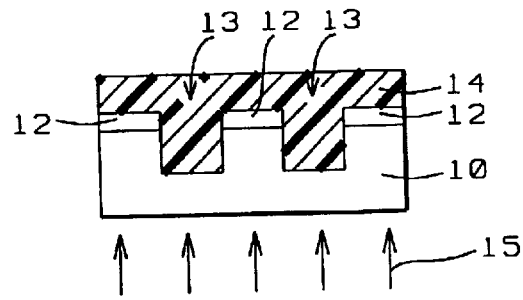
FIG. 1 — Prior Art
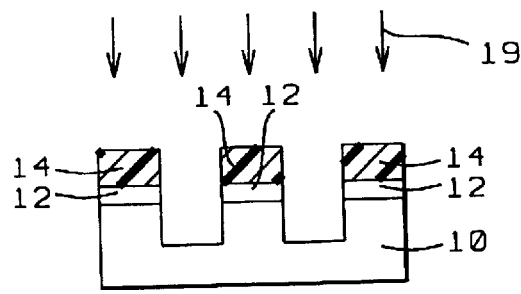
FIG. 2 — Prior Art
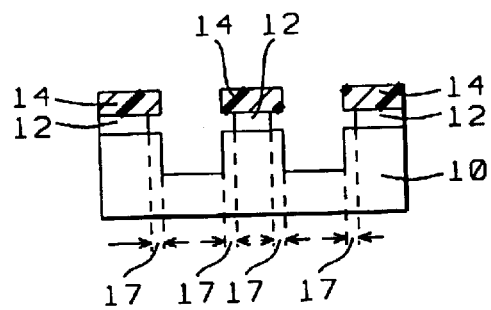
FIG. 3 — Prior Art
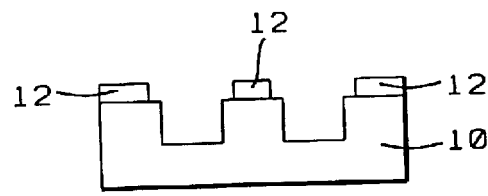
FIG. 4 — Prior Art

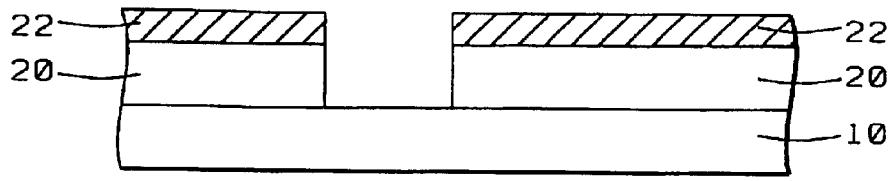
FIG. 5 – Prior Art
FIG. 6 – Prior Art
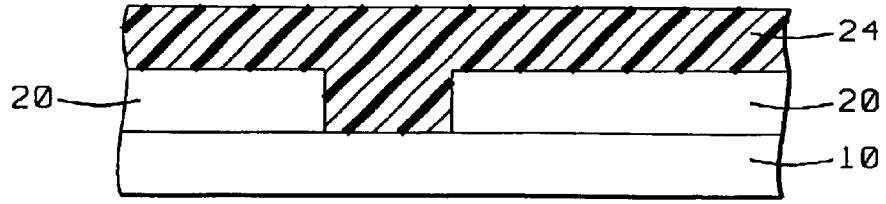
FIG. 7 – Prior Art
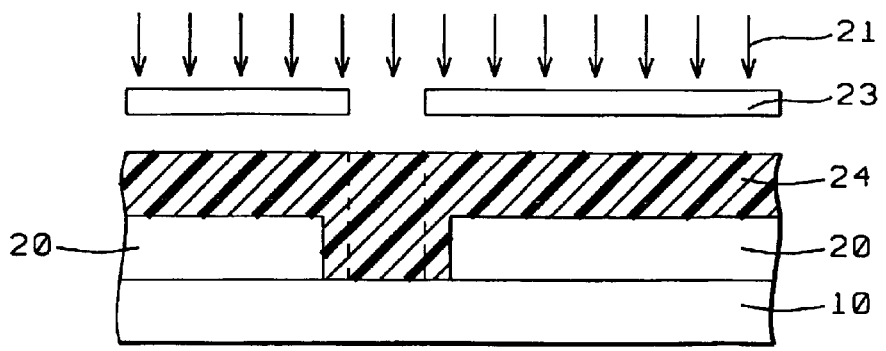
FIG. 8 – Prior Art

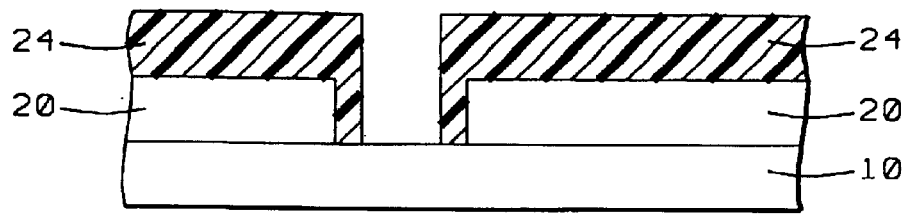
FIG. 9 - Prior Art
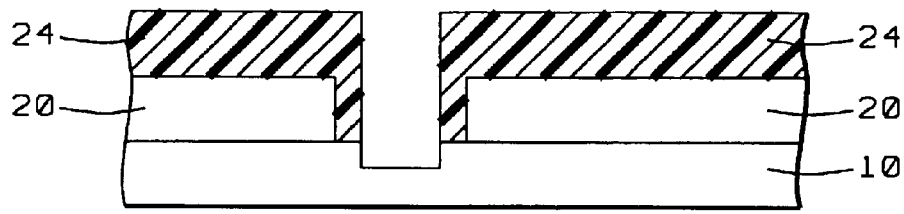
FIG. 10 - Prior Art
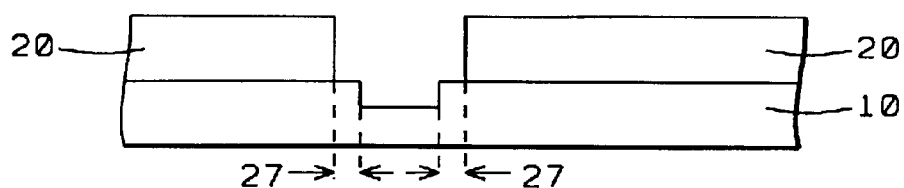
FIG. 11 - Prior Art
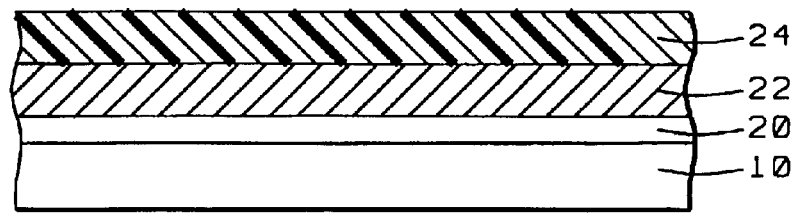
FIG. 12

METHOD OF FABRICATION OF RIM-TYPE PHASE SHIFT MASK

BACKGROUND OF THE INVENTION (1) Field of the Invention

The invention relates to the fabrication of integrated circuit devices, and more particularly, to a method of creating an attenuating rim type phase shift mask.

(2) Description of the Prior Art

One of the major technical disciplines that is used for the creation of semiconductor devices is photolithography, which is frequently and commonly used for the creation of patterns of various designs in layers of semiconductor materials or over semiconductor surfaces. A light source, commonly comprising Ultra Violet or Deep Ultra Violate energy, is used to project an image from a photolithographic mask onto a target surface, such as the surface of a layer of photoresist. The mask that is used between the light source and the target surface is composed of regions of light transparency and regions that completely or partially block light from passing through the mask. These characteristics of the photolithographic mask result in energy being transferred from the light source into the target surface, a transfer that changes chemical and molecular properties of the layer that forms the target surface. Photolithography provides a system of one or more optical lenses through which the light passes before striking the target surface. These lenses have as design objective to create the perfect reflection of the image that is contained in the photolithographic mask onto the exposed surface. Light of the energy source is transmitted to the target surface as waves of a particular frequency. Amplitude and phase of the projected light can, in its passage from source to target, be affected in accordance with the laws of physics. Ideally all the light that strikes the target surface does so under the exact same conditions of frequency, amplitude, phase and angle of impact so that the image that is created in the target surface is uniform across that surface. A serious problem in this respect is the effect of optical diffraction, whereby the light that impacts a surface does so under an angle that varies across the target surface. This effect becomes particularly severe where devices are created of micron or sub-micron dimensions, whereby any deviation from an ideal geometry of the created device features has a relatively large impact. Reduced device feature size also brings with it requirements of improved image resolution since the adjacency between device features across the surface of a semiconductor surface decreases with decreasing device feature size. The resolution of the created image on a target surface is essentially determined by the optimum available numerical aperture of the lens system that is used for the image formation. Improving this performance parameter however is in conflict with the desire to achieve optimum depth of focus of the exposed image, since the depth of focus of a lens system is inversely proportional with the numerical aperture of the lens system. To provide the required ideal image over a target surface, a number of corrective measures can be used that offset the undesirable characteristics of the system that is used to create this image. These corrective measures can make use of one or more of the parameters that play a role in the creation of the ideal image such as light amplitude, frequency and phase. In addition, the method in which the image is created can be changed by for instance "pre-distorting" the image, that is by creating an image before the exposure occurs. By taking into account the distorting effects of the image formation process, an ideal image or an image that closely approaches an ideal image can be formed on the target surface in this manner. It is clear that these corrective measures are highly image dependent in the sense that, across the surface of a relatively large wafer, effects that are applied to the center of the wafer surface may produce entirely different results at the perimeter of the wafer.

One of the frequently applied techniques for the creation of device features that are in close physical proximity is the use of a phase-shift mask of which the attenuating phase shift mask is one application. The invention provides a process of creating a rim type attenuating phase shift mask, whereby the emphasis is placed on providing a simplified and therefore very cost-effective method for the creation of the mask.

U.S. Pat. No. 5,620,817 (Hsu et al.) shows a method for the creation of an Attenuating PSM.

U.S. Pat. No. 5,955,222 (Hibbs et al.) reveals a Rim type PSM and method al.

U.S. Pat. No. 5,300,379 (Dao et al.) shows an inverted PSM.

U.S. Pat. No. 6,007,324 (Tzu et al.) and U.S. Pat. No. 61,294,295 B1 (Lin et al.) are related mask patents.

SUMMARY OF THE INVENTION

A principle objective of the invention is to provide a simplified method of creating a rim-type phase shift mask.

Another objective of the invention is to provide a simplified method of creating a rim-type phase shift mask whereby the mask is created using one layer of photoresist, one exposure dose and one developing solution.

In accordance with the objectives of the invention a new method of provided for the creation of a rim-type phase-shift mask. Successive layers of a first layer of phase shifter material such as MoSiON, of a second layer of chrome and a first layer of photoresist are created over the surface of a quartz substrate. The first layer of photoresist is patterned and developed, creating an opening having a first diameter through the first layer of photoresist. The layer of chrome is etched in accordance with the opening created through the first photoresist mask. The first photoresist mask is removed. The layer of MoSiON is isotropically etched using the patterned and etched layer of chrome as a mask, partially removing the layer of MoSiON from under the chrome mask, creating the rim of the mask having a second diameter over the surface of the quartz substrate. A second layer of photoresist is deposited over the surface of the chrome mask, into the opening created through the layer of chrome and further over the surface of the rim of the mask. The second layer of photoresist is being flood exposed and developed, whereby the patterned and etched layer of chrome serves as a mask, thereby shielding from exposure and therefore leaving in place the second layer of photoresist where this second layer of photoresist overlies the rim of the phase shift mask, the remaining second layer of photoresist forming a protective layer for the layer of MoSiON. The quartz substrate is etched in accordance with the first diameter of the opening created through the second layer of photoresist, the second layer of photoresist is removed from above the rim surface areas of the phase shift mask. The patterned and etched layer of chrome is removed.

BRIEF DESCRIPTION OF THE DRAWINGS

FIGS. 1 through 4 show a first conventional process of creating a rim-type phase shift mask.

FIGS. 5 through 11 show a second conventional process of creating a rim-type phase shift mask, this second conventional process being more closely associated with the invention.

FIGS. 12 through 19 show the process of the invention, as follow:

FIG. 12 shows the cross section of a quartz substrate over the surface of which have successively been deposited a layer of MoSiON, a layer of chrome and a first layer of photoresist.

FIG. 13 shows the cross section after the first layer of photoresist has been patterned and developed, creating an opening having a first diameter through the first layer of photoresist.

FIG. 14 shows a cross section after the layer of chrome has been etched in accordance with the opening created through the first photoresist mask.

FIG. 15 shows a cross section after the first photoresist mask has been removed and the layer of MoSiON has been isotropically etched, using the patterned and etched layer of chrome as a mask, creating an opening having a second diameter through the layer of MoSiON, the difference between the second diameter and the first diameter forming the rim of the rim-type phase shift mask.

FIG. 16 shows a cross section after a second layer of photoresist has been deposited, the second layer of photoresist is being flood exposed, the patterned and etched layer of chrome serving as a mask, thereby shielding the second layer of photoresist from exposure where this second layer of photoresist overlies the rim surface regions of the phase shift mask.

FIG. 17 shows a cross section after a second layer of photoresist has been developed, creating an opening having a first diameter through the second layer of photoresist, leaving layers of photoresist in place over the surface of the rim of the phase shift mask, thereby protecting the layer of MoSiON.

FIG. 18 shows a cross section after the quartz substrate has been etched in accordance with the first diameter of the opening created through the second layer of photoresist, the second layer of photoresist has been removed from above the rim surface areas of the phase shift mask.

FIG. 19 shows a cross section after removal of the patterned and etched layer of chrome.

DESCRIPTION OF THE PREFERRED EMBODIMENTS

Figure 13:
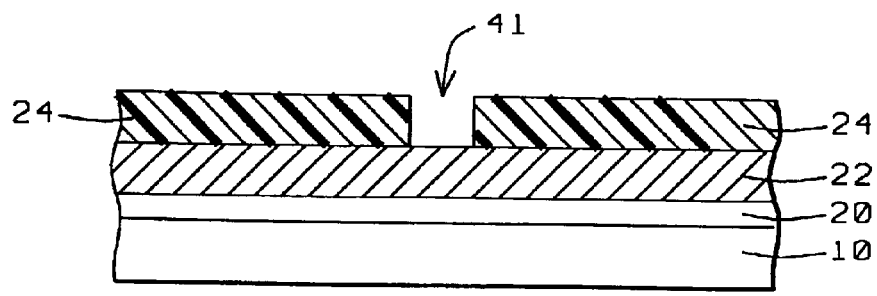

Light diffraction is the modification of light as it passes through opaque surfaces or through narrow slits and in which the light appears to be deflected and produces fringes of parallel light and dark or colored bands of light. The impact that light diffraction has on image formation where the images are of extremely small dimensions (0.5 microns or less) is therefore apparent in that light that is meant for a particular (small) areas readily "spills over" into an immediately adjacent (and equally small) area, thus preventing sharp definitions of the two adjacent areas.

Phase control of the light that is used to create an image can be implemented by making use of the fact that the phase of the light that exits a surface (such as a photo lithographic mask) can be made to relate to the phase of the light as it enters this surface whereby the parameter of control in adjusting this phase relationship is the thickness of the surface through which the light travels. By varying the thickness of the surface through which the light passes (that is having a surface that is not of uniform thickness) the phase of the light can be changed and therefore the amplitude of the light that exits the surface can be controlled (across the surface of for instance a photolithographic mask). The image that is created in this manner can therefore be adjusted or manipulated to compensate for any negative effects that are present in the imaging system. This latter approach may appear to be complex and difficult to implement were it not for the fact that most image processing systems are highly automated and are computerized to a large extent. The design parameters that affect ultimate image qualities can therefore readily be entered into a computer system where they become part of the appropriate support software and can change imaging rules and behavior for optimum results. A computer based design system also lends itself well to implementing requirements of mask exposure over relatively large surfaces and to making exposures that are dependent on the location within a large surface. This latter capability must be considered a basic requirement for any such automated or computer aided design system, since most semiconductor devices are produced using large wafers and are mass produced whereby multiple device features are simultaneously created as part of one exposure sequence.

As a variation on the phase-shift mask the alternating phase-shift mask has been developed and is applied for requirements where even stricter control of light exposures for deep-submicron device features is required. The alternating phase-shift mask uses phase control of light that is passed through the mask but applies this control in an alternating manner by controlling the phase shift for non-adjacent but sequential elements of the phase shift mask. This places additional distance between in-phase exposure of closely spaced elements of an exposed surface of a layer of semiconductor material and therefore further attenuates effects of in-phase light proximity during the exposure.

One of the materials that are frequently used for the creation of complex semiconductor devices and packages is glass. As an example of the application of glass in the creation of a semiconductor related component can be cited the creation of a half-tone shift mask. For the substrate of a half-tone shift mask most typically is used quartz whereby however glass and sapphire can also be used for this purpose. For half-tone shift masks the conventional shifter material is MoSiON. The standard mask comprises a substrate on the surface of which a patterned layer of opaque material is created. Typically used for the opaque material is chromium that has been deposited over the quartz substrate to a thickness of about 1,000 Angstrom. Alternate opaque materials for the creation of the patterned layer on the surface of a photolithographic mask are nickel and aluminum while for more sophisticated masks such as halftone phase shift masks MoSiON is used as the phase shifter material.

Rim-type phase shift masks, also referred to a self-aligned phase-shift masks, are referred to by this term since the light-blocking layer of material that is created over the surface of a substrate is partially removed from this surface, a removal that creates a rim of removed opaque material that surrounds wells or recesses that are created in the surface of the substrate.

The rim-type phase shift mask can be described as comprising:

A substrate, of for instance quartz or glass, through which incident electromagnetic radiation or other actinic energy can pass Wells or recessed portions, having a cross section of a rectangle created in the surface of the substrate, separated by elevations or mesas The surface of the mesas is covered with a layer of blocking material, such as a layer of chromium, for the blocking of electromagnetic radiation or other actinic energy therethrough The blocking material is removed over a measurable distance from the surface of the mesas where these mesas intersect with the wells or recesses created in the surface of the substrate, creating a rim overlying the surface of the mesas where no blocking material is present Design parameters that must be carefully selected and controlled for the creation of a rim-type half-tone mask include a first height of the created mesas where no blocking material overlies the created mesas and extending in accordance there-with through the substrate of the phase-shift mask, thereby specifically controlling this height in relation to a second height of the substrate underlying the created wells or recesses through which the electromagnetic radiation or other actinic energy passes; these latter parameters of first and second height and the ratio thereof in combination with the rim width determine the amount of destructive interfering of the electromagnetic radiation or other actinic energy passing through the substrate, which in turn determines the definition or obtainable contrast of the image that can be created using the rim-type phase shift mask.

For reasons of comparison, a prior art method for the creation of a rim-type is shown in accordance with a presentation of this prior art method are provided by U.S. Pat. No. 5,955,222 (Hibbs et Al.). This comparison will also better highlight concepts of well and mesas and the thereover created rims and their recesses.

Referring for this purpose first to the cross section that is shown in FIG. 1, highlighted in this cross section are:

10, a substrate for the creation of the rim-type phase shift mask, typically comprising quartz 13, wells or recesses created in the surface of substrate 10

12, a blocking mask, typically comprising chrome, created over the surface of substrate 10

14, a layer of photoresist deposited over a second surface of substrate 10 after wells 13 have been created, filling the wells with photoresist 14, and 15, a source of energy that exposes the layer 14 of photoresist in view of the fact that the substrate 10 is transparent to the passage of light energy; due to this transparency and considering that the blocking mask 12 essentially blocks the passage of photo energy before this photo energy reaches layer 14, the layer 14 of photoresist will be affected such that the photoresist 14 overlying trenches 13 can readily be removed, leading to the cross section of FIG. 2.

By now exposing the surface of the structure that is shown in cross section in FIG. 2 to an isotropic etch 19, portions of the layer 12 of chrome can be removed, creating the previously highlighted rim 17, FIG. 3, over the surface of substrate 10 from which the chrome is removed. Layer 12 is, due to the presence of layer 14 of photoresist, etched in accordance with the blocking mask 14 formed by the patterned and developed layer 14 of photoresist. Due however to the isotropic nature of the etch that is applied, the layer 12 of chrome will be etched in a horizontal direction over a measurable distance.

After removing of the layer 14, FIG. 3, of photoresist the cross section of FIG. 4 is obtained, which shows the obtained rim-type phase shift mask. Conventionally, a rim-type mask created in this manner is difficult to control in the desired and exact parameters that have previously been indicated. Especially the amount of etchback of the blocking layer 12 is very time dependent and difficult to achieve to the amount that is desired for optimum operation of the created rim-type shift mask. This etchback is further affected by difficult to control parameters of plasma density of the plasma etch 19, FIG. 2, that is used for the isotropic etch of layer 12.

The prior art related cross sections shown in FIGS. 1 through 4 have been provided to illustrate the concept and construction of a rim-type phase shift mask. The cross sections that are shown in FIG. 5 through 11 as yet illustrate a sequence of processing steps for the creation of a conventional rim-type phase shift mask, these cross sections however are presented to show a prior art method of creating a rim-type phase shift mask that more closely resembles the method of the invention and that is therefore better suited to illustrate the improvements that are provided by the invention. FIG. 5 through 11 are next briefly highlighted.

Referring now specifically to the cross section of FIG. 5, there is shown a cross section of a quartz substrate 10 over the surface of which a patterned and etched layer 20 of MoSiON has been deposited, a patterned and etched layer 22 of chrome has been created over the surface of the layer 20 of MoSiON. The patterned and etched layer 22, FIG. 5, of chrome is then removed, FIG. 6, after which a layer 24 of photoresist is blanket coated over the surface of the layer 20 of MoSiON, creating the cross section that is shown in FIG. 7. The layer 24 of photoresist is then exposed, FIG. 8, applying exposure 21 using the exposure mask 23 for this purpose. This exposes the layer 24 in accordance with the pattern provided by the opening of mask 23, creating the modified layer of photoresist that is bounded and surrounded by the interrupted lines shown through layer 24 in the cross section of FIG. 8. By now removing the exposed photoresist the cross section of FIG. 9 is obtained, which exposes the surface of the quartz substrate 10 in a first pattern whereby the opening that has previously been created through the layer 20 of MoSiON is defined as a second pattern. The quartz substrate 10 is then etched in accordance with the first pattern, FIG. 10, after which the conventional removal of the layer 24 of photoresist creates the rim surfaces of width 27 that have been highlighted in the cross section of FIG. 11.

The invention provides a method that, using a cost-effective sequence of processing steps that can readily be integrated in and adapted to a conventional semiconductor processing sequence, creates a rim-type phase shift mask. The invention will now be described in detail using FIGS. 12 through 19 for this purpose.

Referring first to the cross section that is shown in FIG. 12, there is shown a cross section of a substrate 10 for a rim-type phase shift mask over the surface of which have been created:

first a layer 20 of MoSiON second a layer 22 of chrome, and third, a layer of photoresist.

The standard phase shift mask comprises a substrate, preferably comprising quartz and preferably having a thickness between about 0.2 and 0.3 inches, on the surface of which a patterned layer of phase-shifter material is created, the phase-shifter material typically comprising MoSiON.

The layer 20 of MoSION has previously been highlighted as being the conventional phase shifter material for half-tone shift masks. The layer 20 of MoSION provides 180° phase shift and has a light transmission of between about 5% and 7%.

The layer 22 of opaque material, preferably comprising chrome, is deposited conventional methods such as metal sputter, blanket deposited over the surface of layer 20 of MoSION. The thickness of the deposited layer 22 of chrome is preferably created to a thickness between about 80 and 200 nanometers.

A layer 24 of photoresist is coated over the surface of layer 22, the thickness of layer 24 of photoresist is preferably between about 2,000 and 5,000 Angstrom.

The layer 24 of photoresist is now patterned and developed, using conventional methods of photolithography for the exposure and development of layer 24, creating a mask of photoresist 24, FIG. 13, overlying the surface of layer 22 of chrome.

Figure 14:
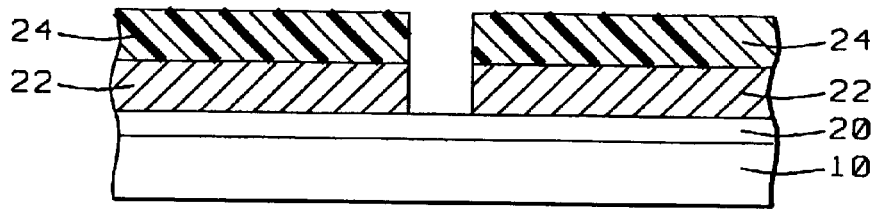

The now exposed surface of layer 22 of chrome, FIG. 14, exposed through opening 41, FIG. 3, is etched by applying a chrome dry etch to the exposed surface of layer 22 of chrome.

Figure 15:
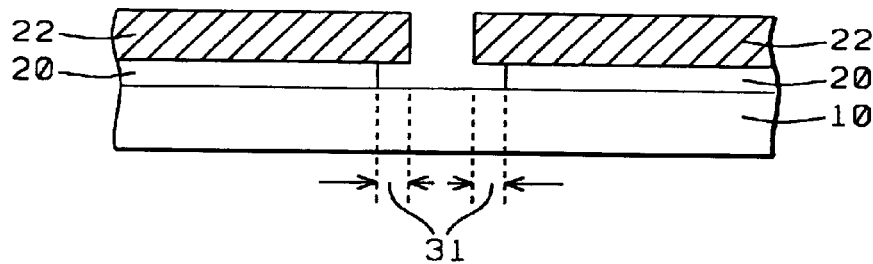

The invention continues with the removal of the photoresist mask 24 shown in FIG. 14, from the layer 22 of patterned and etched chrome after which, FIG. 15, an isotropic dry etch is applied to the layer 20 of MoSION using the patterned and etched layer 22 of chrome as a mask. Due to the isotropic nature of the etch that is applied to layer 20, recesses 31 are created in layer 20 of MoSION, which will be recognized as being the recesses that are required to form the rim of the rim-type phase shift mask.

It must be pointed out and relating to the applied isotropic etch, the results of which are shown in the cross section of FIG. 15, that this isotropic etch is relatively easy to control by adjusting the applied pressure and by further adjusting the $CF_4:O_2$ ratio of the applied etchant. It must further be indicated that this isotropic etch is not dependent on any photolithography alignment, this photolithography alignment has been used in the conventional method of creating a rim-type phase shift mask, as shown in the cross section of FIG. 8. It is therefore easy to perform the isotropic etch of layer 20 of MoSION, FIG. 14, such that the desired and exact design parameters can be achieved for the creation of the recess 31 for the rim of the attenuated phase shifter mask of the invention.

Typical processing conditions for the application of an isotropic etch, applied to the surface of layer 20 of MoSION, are using a pressure of about 150 mTORR, a flow ratio of 100:10 (100 sccm $CF_4$ and 10 sccm $O_2$) and a power of about 200 watts. Under these conditions etch rate is about 400 Angstrom per minute.

Figure 16:
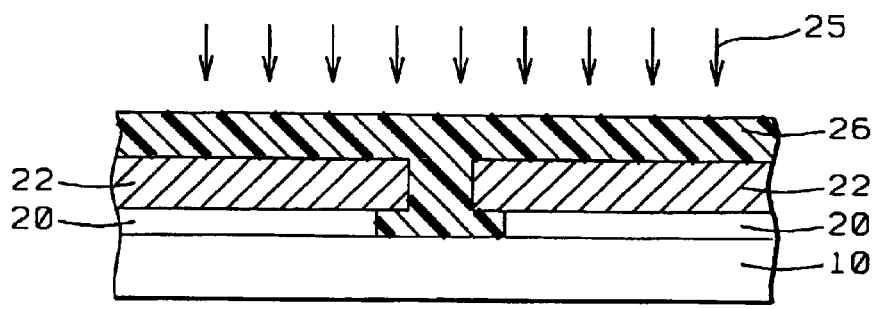

FIG. 16 shows the following step of depositing a layer 26 of photoresist over the surface of the structure created in cross section of FIG. 15. The layer 26 of photoresist can be blanket coated and is therefore not dependent on critical parameters of alignment as for instance the patterned and developed layer 24 of photoresist, shown in the cross section of FIG. 9. The layer 26, FIG. 15, of photoresist is now exposed by applying a flood exposure 25 to the surface thereof, whereby the patterned and etched layer 22 of chrome plays the critical role of functioning as a mask by partially blocking the exposure. The blocked layer of photoresist overlies the previously created rim surface areas 31, FIG. 15, of the substrate 10.

Figure 17:
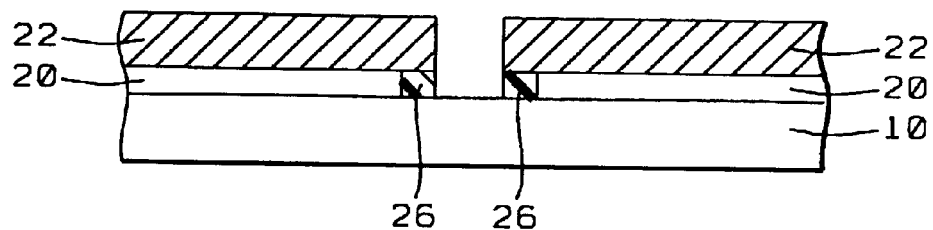

The cross section of FIG. 17 shows, after the exposed layer of photoresist has been removed from above the substrate 10, how small layers 26 of photoresist remain in place inserted in the previously created recesses in the layer 20 of MoSION. These remaining layers 26 of photoresist protect the layer 20 of MoSION during a subsequent step of etching the quartz of substrate 10, the results of which have been highlighted in the cross section of FIG. 18. The layers of photoresist 26 that have been shown in the cross section of FIG. 17 have, in the cross section of FIG. 18, been removed after the quartz substrate 10 has been etched by applying conventional methods of photoresist ashing followed by a thorough surface clean.

Figure 18:
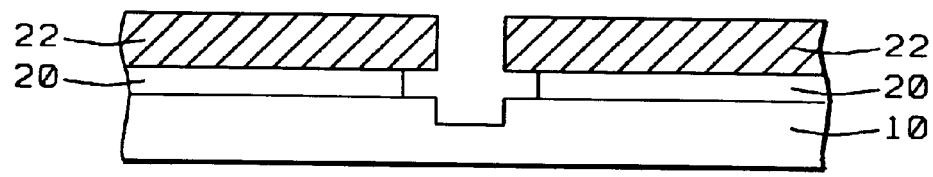
Figure 19:
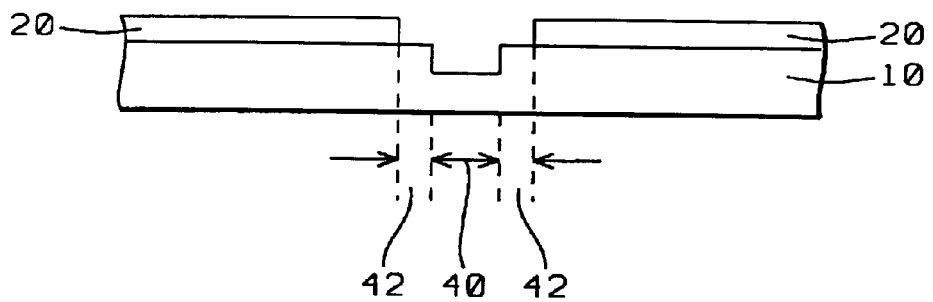

By now removing the remaining layer 22, FIG. 18, of chrome, the rim-type phase shift mask that is shown in cross section in FIG. 19 is completed. Highlighted in the cross section of FIG. 19 are:

40, the 1800 phase shifter region of the phase shift mask, and 42, the rim of the rim-type phase shift mask.

To summarize the essential points of the invention:

resist coating is applied followed by flood exposure of the coated resist forms protective layers over the sidewalls of the recessed layer of MoSION the recesses created in the layer of MoSION, and therewith the created rim of the rim-type phase shift mask, can be accurately controlled by controlling the pressure and the etchant during the isotropic etch that is applied to the layer of MoSION the invention removes the need for photolithography mask alignment the invention removes the dependency of creating rim dimensions based on the creation of a patterned and developed layer of photoresist.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for the creation of a rim-type phase shift mask, comprising the steps of:

providing a substrate for a phase shift mask, said substrate having been provided with a layer of phase shifter material over the surface thereof;

patterning and etching said layer of phase shifter material, thereby creating a first opening having a first width through said layer of phase shifter mask; and patterning and etching said substrate, thereby creating a second opening having a second width into the surface of said substrate, said second width being smaller than said first width by an amount.

2. The method of claim 1, said patterning and etching said layer of phase shifter material comprising the steps of:

depositing a layer of opaque material over the surface of said layer of phase shifter material, said layer of opaque material having been provided with a third opening there-through having said second width, said layer of opaque material forming an exposure mask, exposing the surface of said layer of phase shifter material; and isotropically etching the exposed surface of said layer of phase shifter material, thereby creating a first opening having a first width through said layer of phase shifter material, thereby exposing the surface of said substrate over a surface area of said first width.

3. The method of claim 2, said layer of opaque material having been provided with a third opening there-through having said second width comprising the steps of:

depositing a first layer of photosensitive material over the surface of said layer of opaque material;

patterning and etching said first layer of photosensitive material, thereby creating a fourth opening through said first layer of photosensitive material having said second width, thereby creating a first mask of photosensitive material;

etching said layer of opaque material in accordance with said fourth opening etched through said first layer of photosensitive material, thereby creating said third opening having said second width through said layer of opaque material; and removing said first mask of photosensitive material from the surface of said layer of opaque material.

4. The method of claim 2, said patterning and etching said substrate by applying a second etch resist mask comprising additional steps of:

depositing a second layer of photosensitive material over the surface of said layer of opaque material, thereby including said third opening created through said layer of opaque material, thereby further including said exposed surface of said substrate over a surface area of said first width;

patterning and etching said second layer of photosensitive material by flood exposing the surface of said second layer of photosensitive material whereby said exposure mask of opaque material forms an exposure mask for said second layer of photosensitive material deposited over said exposed surface of said substrate over a surface area of said first width, thereby removing said second layer of photosensitive material from the surface of said layer of opaque material, thereby further creating a fifth opening through said second layer of photosensitive material having said second width, said fifth opening being aligned with said first opening created through said layer of phase shifter mask, a protective layer of said second layer of photosensitive material remaining in place overlying the surface of said substrate over a surface area between said first and said fifth opening;

etching said substrate in accordance with said fifth opening created through said second layer of photosensitive material; and removing said protective layer of said second layer of photosensitive material from the surface of said substrate.

5. The method of claim 4, further comprising a step of removing said opaque material from the surface of said layer of phase shifter material.

6. The method of claim 1, said substrate for a phase shift mask comprising quartz.

7. The method of claim 1, said phase shifter material comprising MoSiON.

8. The method of claim 2, said layer of opaque material comprising chrome.

9. The method of claim 3, said first layer of photosensitive material comprising photoresist.

10. The method of claim 4, said second layer of photosensitive material comprising photoresist.

11. The method of claim 2, said isotropically etching the exposed surface of said layer of phase shifter material comprising using a pressure of about 150 mTORR, a flow ratio of 100:10 (100 sccm $CF_4$ and 10 sccm $O_2$) and a power of about 200 watts.

12. A method for the creation of a rim-type phase shift mask, comprising the steps of:

providing a substrate for a phase shift mask, said substrate having been provided with a first layer of phase shifter material over the surface thereof, said substrate further having been provided with an opaque material over the surface of said first layer of phase shifter material;

patterning and etching said opaque material, creating an opening having a second width through said layer of opaque material, exposing the surface of said first layer of phase shifter material;

isotropically etching the exposed surface of said first layer of phase shifter material in accordance with said opening created through said layer of opaque material, thereby creating an opening having a first width in said first layer of phase shifter material, exposing the surface of said substrate, said first width being larger than said second width by a measurable amount; and etching the surface of said substrate in accordance with said opening having a second width created through said layer of opaque material.

13. The method of claim 12, additionally removing said layer of opaque material from the surface of said layer of phase shifter material.

14. The method of claim 12, said substrate for a phase shift mask comprising quartz.

15. The method of claim 12, said phase shifter material comprising MoSiON.

16. The method of claim 12, said layer of opaque material comprising chrome.

17. The method of claim 12, said etching the surface of said substrate in accordance with said opening having a second width created through said layer of opaque material comprising the steps of:

depositing a layer of photosensitive material over the surface of said patterned and etched opaque material, thereby including said opening having a second width created through said layer of opaque material, thereby further including said exposed surface of said first layer of phase shifter material;

creating an opening through said layer of photosensitive material having said second width and being aligned with said opening having a second width created through said layer of opaque material, said opening exposing the surface of said substrate; and etching the substrate of said substrate in accordance with said opening created through said layer of photosensitive material.

18. The method of claim 17, said creating an opening through said layer of photosensitive material comprising a step of flood exposure of said layer of photosensitive material.

19. The method of claim 12, said isotropically etching the exposed surface of said first layer of phase shifter material comprising using a pressure of about 150 mTORR, a flow ratio of 100:10 (100 sccm $CF_4$ and 10 sccm $O_2$) and a power of about 200 watts.

20. A method for the creation of a rim-type phase shift mask, comprising the steps of:

providing a substrate for a phase shift mask, said substrate having been provided with a first layer of phase shifter material over the surface thereof, said substrate further having been provided with an opaque material over the surface of said first layer of phase shifter material;

patterning and etching said layer of phase shifter material, creating a first opening having a first width therethrough;

providing a protective layer for said patterned and etched layer of phase shifter material; and etching the surface of said substrate for a phase shift mask, creating aligned with said first opening a second opening having a second width into the surface of said substrate, said second width being smaller than said first width by a measurable amount.

21. The method of claim 20, said patterning and etching said layer of phase shifter material comprising the steps of:

depositing a layer of opaque material over the surface of said layer of phase shifter material;

patterning and etching said layer of opaque material, creating a first opening having a second width therethrough, exposing the surface of said layer of phase shifter material; and isotropically etching the exposed surface of said layer of phase shifter material, thereby exposing the surface of said substrate over a surface area of a first width.

22. The method of claim 21, said providing a protective layer for said patterned and etched layer of phase shifter material comprising additional steps of:

depositing a layer of photosensitive material over the surface of said layer of opaque material, thereby including said opening having a second width there-through, thereby further including said exposed surface of said substrate over a surface area of said first width;

flood exposing the surface of said deposited layer of photosensitive material, whereby said patterned and etched layer of opaque material serves as an exposure mask; and removing said exposed layer of photosensitive material from the surface of said opaque layer of material and further from the surface of said substrate in accordance with said opening having a second width created therethrough, thereby exposing the surface of said substrate over a surface area of said second width.

23. The method of claim 22, said etching the surface of said substrate for a phase shift mask comprising the step of etching the surface of said substrate in accordance with said exposure of the surface of said substrate over a surface area of said second width.

24. The method of claim 23, further comprising a step of removing said opaque material from the surface of said layer of phase shifter material.

25. The method of claim 20, said substrate for a phase shift mask comprising quartz.

26. The method of claim 20, said phase shifter material comprising MoSiON.

27. The method of claim 21, said layer of opaque material comprising chrome.

28. The method of claim 21, said isotropically etching the exposed surface of said layer of phase shifter material comprising using a pressure of about 150 mTORR, a flow ratio of 100:10 (100 sccm $CF_4$ and 10 sccm $O_2$) and a power of about 200 watts.

29. A method for creation of a rim-type phase shift mask, comprising the steps of: providing a substrate for a phase shift mask, said substrate having been provided with a layer of phase shifter material over the surface thereof;

patterning and isotropically etching said layer of phase shifter material, thereby creating a first opening a first width through said layer of phase shifter mask; and patterning and etching said substrate, thereby creating a second opening having a second width into the surface of said substrate, said second width being smaller than said first width by an amount.

* * * * *